(12) United States Patent
Viehmann

(10) Patent No.: US 6,510,079 B2
(45) Date of Patent: Jan. 21, 2003

(54) MRAM CONFIGURATION

(75) Inventor: Hans-Heinrich Viehmann, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/975,058

(22) Filed: Oct. 11, 2001

(65) Prior Publication Data

US 2002/0044482 A1 Apr. 18, 2002

(30) Foreign Application Priority Data

Oct. 11, 2000 (DE) .......................... 100 50 365

(51) Int. Cl.⁷ .............................................. G11C 11/14
(52) U.S. Cl. ...................................................... 365/158
(58) Field of Search ................................ 365/158, 157, 365/159, 171, 173

(56) References Cited

U.S. PATENT DOCUMENTS

| 5,946,227 | A | 8/1999 | Naji | 365/158 |
| 6,272,041 | B1 * | 8/2001 | Naji | 365/158 |

* cited by examiner

*Primary Examiner*—Tan T. Nguyen
(74) *Attorney, Agent, or Firm*—Laurence A. Greenberg; Werner H. Stemer; Gregory L. Mayback

(57) ABSTRACT

A MRAM configuration in which the word lines have a low-resistance connection to the programming lines and the sources of the select transistors can be connected to the potential of the gates or the programming line. In this manner, the select transistors can be turned off reliably during programming or writing, but the intention being that no area will be needed for an additional metal line for a low-resistance connection or the gate line.

7 Claims, 1 Drawing Sheet

MRAM CONFIGURATION

BACKGROUND OF THE INVENTION

Field of the Invention

The present invention relates to a magnetoresistive random access memory (MRAM) having a memory cell array containing a large number of memory cells. The memory cells are each located at crossing points of word or gate lines and programming lines, on the one hand, and bit lines, on the other hand, and each contains a magnetic tunnel junction (MTJ) cell and a selection transistor.

In the MTJ cell, as is known, a hard magnetic layer, a tunnel barrier layer and a soft magnetic layer are stacked one above another. The MTJ cells are located at the crossing points of the programming lines with the bit lines. The stored content of an MTJ cell is determined by its resistance value. If the hard magnetic layer and the soft magnetic layer are magnetized parallel to each other in the same direction, then the resistance value of the MTJ cell is lower than in the case of anti-parallel magnetization. The magnetization direction in the soft magnetic layer can be reversed, by currents being sent in appropriate directions through the programming and bit lines associated with the MTJ cell. In this case, at least in one of these lines—as a rule in the programming line—the current direction can be reversible. The low and the high resistance values of the MTJ cell can then be assigned to an information content "1" or "0" or vice versa.

The programming or writing of the memory cell is then done in that, with the selection transistor turned off, currents are sent through the bit and programming lines belonging to the memory cell in such an intensity and direction that the magnetic fields generated by the currents bring the MTJ cell into the low-resistance state (parallel magnetization direction in the soft magnetic layer and the hard magnetic layer) or into the high-resistance state (anti-parallel magnetization in the soft magnetic layer and the hard magnetic layer).

In order to read from the memory cell, the programming line is not needed. Instead, here the selection transistor is switched on and a specific potential is applied to the bit line, so that there flows through the MTJ cell a current whose magnitude depends on the resistance value, that is to say on the information content, of the cell. By evaluating the current, the stored content can therefore be read out.

As has already been mentioned above, during the programming of the memory cells of the MRAM configuration, all the gates of the selection transistors must be connected to ground, in order to turn them off. In this case, it is assumed that the selection transistors are n-channel MOS transistors. This is because, only with the selection transistors turned off is it possible to prevent additional currents from flowing through the MTJ cells, which would distort their programming or even make it impossible. In order to enable rapid switching of the selection transistor, the gate or word line connecting the gates must be connected with low resistance.

Known memory cells in each case contain the MTJ cell and the selection transistor. The MTJ cells, having a soft magnetic layer, a tunnel barrier layer and a hard magnetic layer, are located at crossing points of programming lines (programming line in the X direction) and bit lines (programming line in the Y direction).

A gate line, formed of polycrystalline silicon, for example, connects the gates of the selection transistors of one row to one another. In order to connect the gate line with a low resistance, an additional metal line runs parallel to it, and, at least after a few selection transistors, has a low-resistance connection to the gate line.

In this way, the gates of the selection transistors can be connected to ground reliably and quickly, in order in this way to turn the selection transistors off and to be able to perform programming of a selected MTJ cell, by appropriate currents being sent through the bit line associated with the MJT cell and, likewise, through the associated programming line.

Such an additional metal line certainly ensures a low-resistance connection of the gate line. However, it requires a relatively large amount of area and increases the size of the necessary region of a cell, the cell area as it is known, by about 50%, which is extremely undesirable.

SUMMARY OF THE INVENTION

It is accordingly an object of the invention to provide a MRAM configuration that overcomes the above-mentioned disadvantages of the prior art devices of this general type, in which the selection transistors can be turned off reliably during programming or writing, but the intention being that no area will be needed for an additional metal line for a low-resistance connection or the gate line.

With the foregoing and other objects in view there is provided, in accordance with the invention, a magnetoresistive random access memory (MRAM) configuration. The memory contains word lines, programming lines, bit lines crossing the word lines and the programming lines, and a memory cell array having a plurality of memory cells disposed at crossing points of the word lines with the bits lines and at crossing points of the programming lines with the bit lines. Each of the memory cells has a magnetic tunnel junction (MTJ) cell and a selection transistor with a source electrode disposed facing away from the MTJ cell. The programming lines having a low-resistance connection to the word lines, and during programming of the memory cells, the source electrode is able to be connected to a potential of a respective programming line, so that the selection transistor is turned off.

According to the invention, in the case of a MRAM configuration of the type mentioned at the beginning, the object is achieved by the fact that the programming line has a low-resistance connection to the word or gate line and, during the programming of the memory cells, the source or drain electrode belonging to the selection transistor and facing away from the MTJ cell is capable of being connected to a potential that turns off the selection transistors, preferably to the potential of the programming line.

In the MRAM configuration according to the invention, therefore, the programming line that is present in any case is used to connect the gates of the selection transistors to a potential such that they are turned off. However, since the programming line is at a potential of about 1 V during the programming of the MTJ cells, if the gate line were to be connected to the programming line, the selection transistors would be turned on, which is not intended to be the case, in order to avoid the aforementioned additional currents. However, the additional currents are now avoided by the electrodes that belong to the selection transistors, generally their sources, which face away from the MTJ cells and are intrinsically connected to ground, likewise being connected to 1 V.

In other words, in the case of the MRAM configuration according to the invention, during programming, the gates of the selection transistors are connected to the programming line and the sources are brought to the potential of the gates or the programming line, as a result of which the undesired currents through the selection transistors are suppressed. In order to achieve this, the sources of the selection transistors are connected together and to a common source line, which is connected to the potential of the programming line.

Instead of the sources, if necessary the drains of the selection transistors can also be connected to one another and connected to the potential of the gate line or programming line, if the sources of the selection transistors are connected to the MTJ cells.

In accordance with an added feature of the invention, the word lines are formed of polycrystalline silicon.

In accordance with an additional feature of the invention, the low-resistance connection between a respective one of the word lines and an associated one of the programming lines is one of a plurality of low resistance connections between the respective one of the word lines and the associated one of the programming lines, and at least two of the memory cells are disposed between each of the low resistance connections.

In accordance with a further feature of the invention, the potential of the respective programming line during the programming is about 1 V.

In accordance with another feature of the invention, a common line is provided and the source electrode of the selection transistor is connected to the common line and to other source electrodes of other selection transistors.

In accordance with a concomitant feature of the invention, the selection transistor has a source connected to the source electrode and the source electrode is connected to the common source line.

Other features which are considered as characteristic for the invention are set forth in the appended claims.

Although the invention is illustrated and described herein as embodied in a MRAM configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
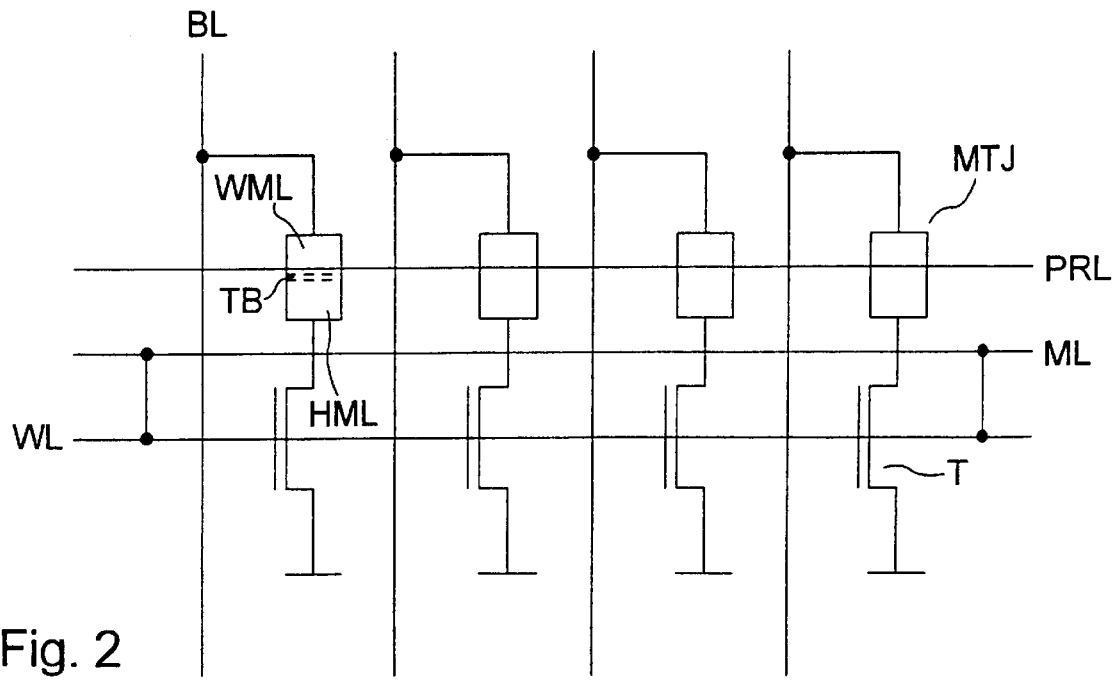
FIG. 2 is a circuit diagram of a prior art MRAM configuration.

In all the figures of the drawing, sub-features and integral parts that correspond to one another bear the same reference symbol in each case. Referring now to the figures of the drawing in detail and first, particularly, to FIG. 2 thereof, there is shown memory cells in each case containing a MTJ cell MTJ and a selection transistor T. The MTJ cells, having a soft magnetic layer WML, a tunnel barrier layer TB and a hard magnetic layer HML, are located at crossing points of programming lines PRL (programming line in the X direction) and bit lines BL (programming line in the Y direction).

A gate or word line WL, formed of polycrystalline silicon, for example, connects gates of the selection transistors T of one row to one another. In order to connect the word line WL with a low resistance, an additional metal line ML runs parallel to it, and, at least after a few selection transistors, has a low-resistance connection to the word line WL.

In this way, the gates of the selection transistors T can be connected to ground reliably and quickly, in order in this way to turn the selection transistors T off and to be able to perform programming of a selected MTJ cell, by appropriate currents being sent through the bit line BL associated with the MTJ cell and, likewise, through the associated programming line PRL.

Such an additional metal line ML certainly ensures a low-resistance connection of the word line WL. However, it requires a relatively large amount of area and increases the size of the necessary region of a cell, the cell area as it is known, by about 50%, which is extremely undesirable.

Figure 1:
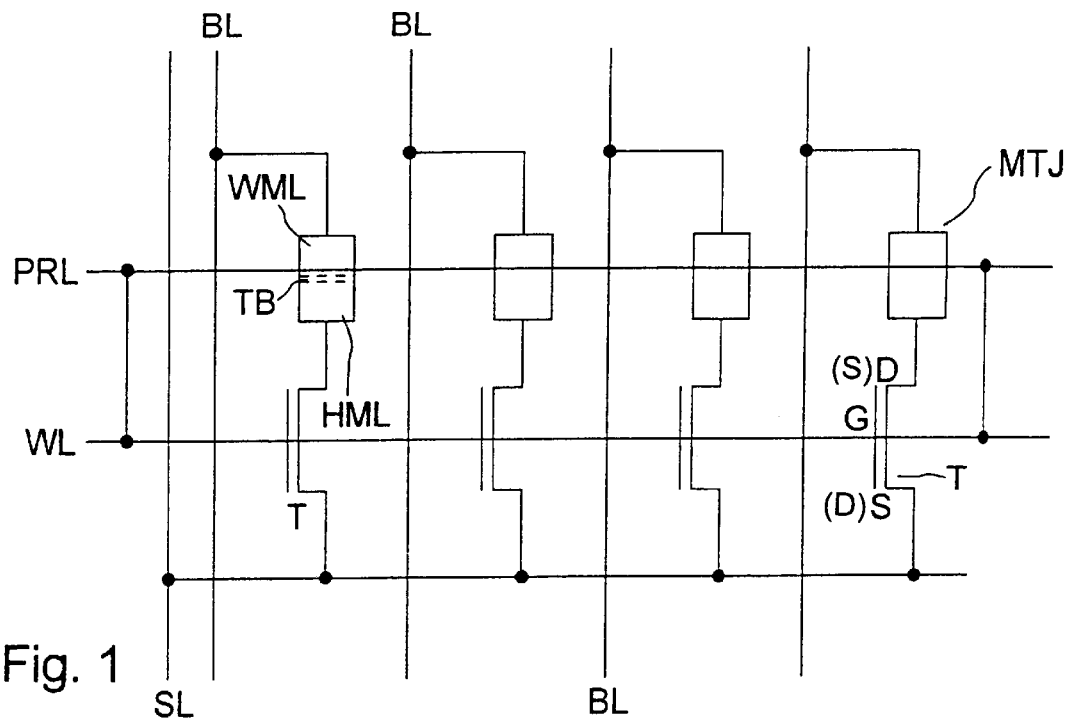
FIG. 1 is a circuit diagram of an MRAM configuration according to the invention.

As can be seen from FIG. 1, in the MRAM configuration according to the invention, the polycrystalline gates of the selection transistors T, forming the word line WL, have a low-resistance connection to the programming line PRL. In order then nevertheless to switch off the associated selection transistor T when programming the MTJ cell MTJ, although the gate of the transistor T is connected to the programming line PRL, which is at a potential of about 1 V, the source of the selection transistor T is connected to the same potential as its gate, that is to say to the potential of the programming line PRL. To this end, the sources S of the selection transistors T of one row of the memory cells are connected to one another and to a source line SL. Via the source line SL, it is in this way possible for the sources S of the selection transistors T of a selected row of memory cells in a memory cell array to be connected to the potential of the programming line PRL associated with the row. Instead of the potential of the programming line PRL, a different potential, which turns the selection transistors T off, can also be selected. Therefore the gate G and source S of the selection transistors T are at the same potential, so that additional currents can reliably be avoided.

In this case, it is important in the MRAM configuration according to the invention that no additional metal line needs to be led over the memory cell array for each line, which results in a considerable saving in area. Instead, it is sufficient, by use of an additional source line at the edge of the memory cell array, to provide the possibility of switching all the selection transistors T of the memory cell array in such a way that in the transistors T the gate G and the source S are at the same potential.

During the programming of the MRAM configuration, in each case only the programming line PRL of a selected row of the memory cell array is brought to the potential of about 1 V, while the programming lines of the remaining rows of the memory cell array remain at 0 V. Raising the source voltages of unselected rows to about 1 V does not cause any damage, so that all the sources of the selection transistors T can be connected to the source line SL.

I claim:

1. A magnetoresistive random access memory (MRAM) configuration, comprising:
   word lines;
   programming lines;
   bit lines crossing said word lines and said programming lines; and
   a memory cell array containing a plurality of memory cells disposed at crossing points of said word lines with said bits lines and at crossing points of said programming lines with said bit lines, each of said memory cells having a magnetic tunnel junction (MTJ) cell and a selection transistor with a source electrode disposed facing away from said MTJ cell, said programming lines having a low-resistance connection to said word lines, and during programming of said memory cells, said source electrode is able to be connected to a potential of a respective programming line, so that said selection transistor is turned off.

2. The MRAM configuration according to claim 1, wherein said word lines are formed of polycrystalline silicon.

3. The MRAM configuration according to claim 1, wherein said low-resistance connection between a respective one of said word lines and an associated one of said programming lines is one of a plurality of low resistance connections between the respective one of said word lines and said associated one of said programming lines, and at least two of said memory cells are disposed between each of said low resistance connections.

4. The MRAM configuration according to claim 1, wherein the potential of said respective programming line during the programming is about 1 V.

5. The MRAM configuration according to claim 1, including a common source line and said source electrode of said selection transistor is connected to said common source line and to other source electrodes of other selection transistors.

6. The MRAM configuration according to claim 5, wherein said selection transistor has a source connected to said source electrode and said source electrode is connected to said common source line.

7. A magnetoresistive random access memory (MRAM) configuration, comprising:
   word lines;
   programming lines;
   bit lines crossing said word lines and said programming lines; and
   a memory cell array containing a plurality of memory cells disposed at crossing points of said word lines with said bits lines and at crossing points of said programming lines with said bit lines, each of said memory cells having a magnetic tunnel junction (MTJ) cell and a selection transistor with a drain electrode disposed facing away from said MTJ cell, said programming lines having a low-resistance connection to said word lines, and during programming of said memory cells, said drain electrode is able to be connected to a potential of a respective programming line, so that said selection transistor is turned off.

* * * * *